United States Patent
Potin et al.

(10) Patent No.: US 10,279,308 B2
(45) Date of Patent: May 7, 2019

(54) METHOD FOR TREATING WASTE GAS CONTAINING POLYCYCLIC AROMATIC HYDROCARBONS

(71) Applicant: HERAKLES, Le Haillan (FR)

(72) Inventors: Jean-François Potin, Merignac (FR); Bernard Delperier, Merignac (FR)

(73) Assignee: SAFRAN CERAMICS, Le Haillan (FR)

( * ) Notice: Subject to any disclaimer, the term of this patent is extended or adjusted under 35 U.S.C. 154(b) by 326 days.

(21) Appl. No.: 15/123,472

(22) PCT Filed: Mar. 4, 2015

(86) PCT No.: PCT/FR2015/050523
§ 371 (c)(1),
(2) Date: Sep. 2, 2016

(87) PCT Pub. No.: WO2015/132527
PCT Pub. Date: Sep. 11, 2015

(65) Prior Publication Data
US 2017/0072363 A1    Mar. 16, 2017

(30) Foreign Application Priority Data
Mar. 5, 2014    (FR) ..................................... 14 51793

(51) Int. Cl.
*B01D 53/14* (2006.01)
*C23C 16/44* (2006.01)

(52) U.S. Cl.
CPC ..... *B01D 53/1493* (2013.01); *B01D 53/1487* (2013.01); *C23C 16/4412* (2013.01); *B01D 2252/205* (2013.01); *B01D 2252/504* (2013.01); *B01D 2257/7027* (2013.01); *B01D 2258/0216* (2013.01); *Y02C 20/30* (2013.01)

(58) Field of Classification Search
CPC ........ B01D 2252/205; B01D 2252/504; B01D 2257/7027; B01D 2258/0216; B01D 53/1487; B01D 53/1493; C23C 16/4412; Y02C 20/30

See application file for complete search history.

(56) References Cited

U.S. PATENT DOCUMENTS

| | | | |
|---|---|---|---|
| 5,019,143 A | 5/1991 | Mehrta | |
| 5,406,802 A | 4/1995 | Forte | |
| 8,128,737 B2 * | 3/2012 | Lomax, Jr. | B01D 53/1487 95/159 |

FOREIGN PATENT DOCUMENTS

| | | | |
|---|---|---|---|
| WO | WO 03/047725 A2 | 6/2003 | |
| WO | WO-03047725 A2 * | 6/2003 | ......... B01D 53/1487 |
| WO | WO 2010/085244 A1 | 7/2010 | |

OTHER PUBLICATIONS

International Search Report as issued in International Patent Application No. PCT/FR2015/050523, dated Mar. 21, 2016.

* cited by examiner

*Primary Examiner* — Cabrena Holecek
(74) *Attorney, Agent, or Firm* — Pillsbury Winthrop Shaw Pittman LLP

(57) ABSTRACT

A process for treating effluent gas containing polycyclic aromatic hydrocarbons includes a step of spray scrubbing with a mineral oil in order to trap the hydrocarbons, wherein the mineral oil includes a mixture of aromatic mineral oil and naphthenic mineral oil.

19 Claims, 2 Drawing Sheets

METHOD FOR TREATING WASTE GAS CONTAINING POLYCYCLIC AROMATIC HYDROCARBONS

CROSS-REFERENCE TO RELATED APPLICATIONS

This is the U.S. National Stage of PCT/FR2015/050523, filed Mar. 4, 2015, which in turn claims priority to French Patent Application No. 1451793, filed Mar. 5, 2014, the entire contents of all applications are incorporated herein by reference in their entireties

FIELD

The present invention relates to the treatment of effluent gas containing polycyclic aromatic hydrocarbons.

The field of application of the invention is more particularly that of treating effluent gas produced by industrial chemical vapor infiltration or deposition facilities for the formation of a pyrolytic carbon deposit on substrates or for the densification of porous substrates by a pyrolytic carbon matrix.

BACKGROUND

Such facilities are very well known. Substrates to be coated or to be densified by pyrolytic carbon are placed in a furnace into which a reactive gas containing one or more precursors of the carbon is introduced. The precursor gas is a hydrocarbon, typically methane, propane or a mixture of the two. The pressure and the temperature in the furnace are adjusted in order to produce the pyrolytic carbon coating or matrix by decomposition (cracking) of the precursor gas in contact with the substrates. The effluent gas containing reaction by-products is removed from the furnace by continuous pumping.

The reaction by-products comprise organic compounds that have a relatively high solidification temperature, in particular polycyclic aromatic hydrocarbons (PAHs) such as, notably, naphthalene, pyrene, anthracene, acenaphthylene, etc. A list of the PAHs is indicated in the table below:

| PAH | CAS No. |
|---|---|
| Naphthalene | 91-2062 |
| Acenaphthylene | 208-96-8 |
| Acenaphthalene | 83-32-9 |
| Fluorene | 86-73-7 |
| Anthracene | 120-12-7 |
| Phenanthrene | 85-01-08 |
| Fluoranthene | 206-44-0 |
| Pyrene | 129-00-0 |
| Benzo(a)anthracene | 56-55-3 |
| Chrysene | 218-01-9 |
| Benzo(a)pyrene | 50-32-8 |
| Benzo(b)fluoranthene | 205-99-2 |
| Dibenzo(ah)anthracene | 53-70-3 |
| Benzo(k)fluoranthene | 207-08-9 |
| Benzo(ghi)perylene | 191-24-2 |
| Indeno(123cd)pyrene | 193-39-5 |

By condensing, these reaction by-products form tars which have a tendency to be deposited in the outlet lines of the furnace as the effluent gas cools. These tars are also found in the pumping device, for example in the oil of vacuum pumps or in the condensates of steam ejectors.

Similar problems may be encountered with industrial facilities other than chemical vapor infiltration or deposition furnaces that use hydrocarbons as reactive gas, for example carburizing furnaces.

It is known from application WO 03/047725 to use an aromatic mineral oil to treat the effluent gas containing tars and in particular polycyclic aromatic hydrocarbons (PAHs) by a step of spray scrubbing with this oil. The trapping of the PAHs is followed by raising the level in the tar trap. From a certain threshold of captured PAHs, the PAH-loaded oil is removed in order to be replaced by fresh oil; the current threshold is at around 30% uptake by volume. By continuing the use of the oil we have shown that the trapping efficiency is maintained up to more than 60% by volume. Unfortunately, even though the trapping may be maintained up to these levels, the physicochemical characteristics (density, viscosity) of the PAH-loaded oil change over time as a function of its PAH content. In particular, its viscosity will increase to unacceptable values that will prevent the pumping and spraying thereof. The utilization time of this aromatic mineral oil is therefore limited, which makes it necessary to replace it and therefore renders the process expensive.

Patent application WO 2010/085244 describes the use of food oil for eliminating PAHs from gas. However, this type of oil has the disadvantage of degrading thermally. Thus, it is necessary to cool the gas before scrubbing it with the oil so as to obtain a scrubbing temperature below 80° C. and even below 50° C. ([0023] page 7). Naphthenic oils are cited in table 1 on page 14 of this document but are not considered to be of interest due to the low solubility level of the PAHs in these oils.

Application U.S. Pat. No. 5,019,143 describes the use of various solvents selected from the group consisting of paraffinic solvents, naphthenic solvents, aromatic compounds or other solvents for extracting ethylene from a gas that also contains heavier unsaturated and saturated hydrocarbons. However, the naphthenic solvents cited are not naphthenic oils. In addition, this document does not encourage the mixing of the various types of solvents. Furthermore, this document does not at any time indicate that the gas to be treated contains PAHs. Finally, the operating pressure of the process is very high (between 50 and 400 psi, i.e. between 0.34 MPa and 2.76 MPa).

SUMMARY

The inventors discovered that it was possible to add a naphthenic aromatic oil to the aromatic mineral oil in order to reduce its viscosity and allow a longer use of this oil, without however hampering its ability to trap PAHs. This mineral oil makes it possible to lower the viscosity of the aromatic mineral oil which makes it possible to prolong its utilization time.

The present invention therefore relates to a process for treating effluent gas containing polycyclic aromatic hydrocarbons comprising a step of spray scrubbing with a mineral oil in order to trap said hydrocarbons, characterized in that the mineral oil comprises (advantageously consists of) a mixture of aromatic mineral oil and naphthenic mineral oil.

BRIEF DESCRIPTION OF THE DRAWINGS

The invention will be better understood in light of the examples and the description of the figures that follow.

DETAILED DESCRIPTION

Figure 1:
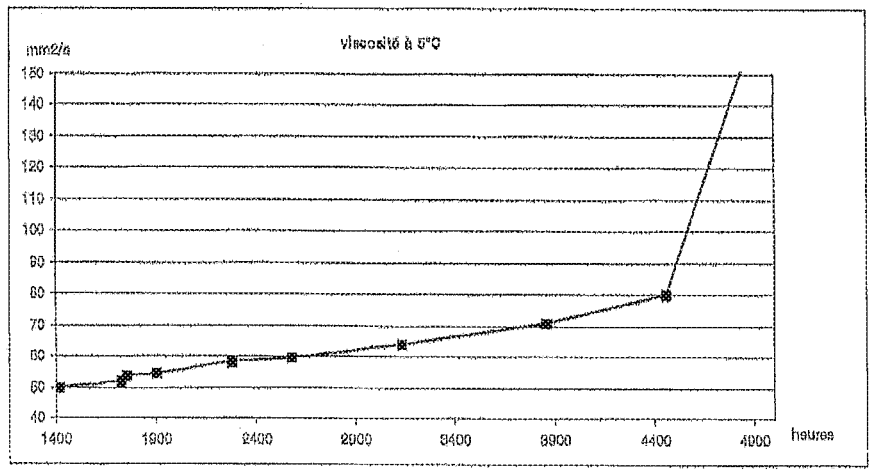
FIG. 1 represents the viscosity at 5° C. of a "Jarytherm AX 320" oil used in the process described by patent application WO 03/047725 as a function of the utilization time.

In an aspect of the invention, there is provided a process for treating effluent gas containing polycyclic aromatic hydrocarbons comprising a step of spray scrubbing with a mineral oil in order to trap said hydrocarbons, characterized in that the mineral oil comprises (advantageously consists of) a mixture of aromatic mineral oil and naphthenic mineral oil With respect to other gas scrubbing techniques, spray scrubbing makes it possible to limit the pressure drop undergone by the gas and to minimize the formation of tar deposits on walls, such as could be the case with the use of plate scrubbing towers. In one advantageous embodiment, the scrubbing step is carried out at a pressure between $1\times10^3$ and $1\times10^5$ Pa, advantageously at a pressure of 1000 Pa (10 mbar absolute), even though such a pressure does not facilitate the condensation of the PAHs which limits the absorption of the PAHs by the oil. In another advantageous embodiment, the scrubbing step is carried out at a temperature below 20° C., advantageously below 0° C.

Advantageously, the oil mixture comprises at least 20% by volume of aromatic mineral oil relative to the total volume of the mixture, advantageously at least 30% by volume of aromatic mineral oil. The content of naphthenic mineral oil depends on the viscosity to be achieved in the mixture. The oil mixture may comprise at most 80% by volume of naphthenic mineral oil relative to the total volume of the mixture, in particular at most 70% by volume of naphthenic mineral oil. In one advantageous embodiment, the oil mixture comprises at least 10% by volume of naphthenic mineral oil relative to the total volume of the mixture, in particular at least 14% by volume of naphthenic mineral oil, more particularly at least 20% by volume of naphthenic mineral oil. Even more advantageously, the oil mixture has a viscosity less than or equal to 150 mm$^2$/s at 0° C. Measurement of the kinematic viscosity of an oil according to the invention is carried out according to the ASTM D445 standard with an Ubbelohde viscometer with capillaries having a diameter of 0.88 mm. The viscosities are measured at 5° C. and 10° C. and the viscosity at 0° C. is obtained by linear extrapolation. This is because the measurement at 0° C. cannot be carried out directly due to the condensation formed because of the large temperature difference between the part and the analysis system. The constant of the viscometer is measured with undecane.

Advantageously, the aromatic mineral used in the process according to the present invention is as described in patent application WO 03/047725. In particular, the aromatic mineral oil must remain in the liquid phase during the scrubbing process in order not to produce vapor that is entrained by the effluent gas. In the case in particular of effluent gas from the chemical vapor infiltration or deposition furnace, the pressure of the effluent gas at the outlet of the furnace is relatively low. The oil used must therefore have a low enough vapor pressure not to vaporize at the pressure prevailing at the outlet of the furnace, in order not to load the effluent gas with oil vapor. By way of indication, the pressure in the furnace during various phases of the infiltration procedure may be less than around 200 Pa. The scrubbing oil must therefore advantageously have a low vapor pressure, preferably of less than 1 Pa at 0° C. In addition, the composition of the oil must allow good absorption of the tars to be trapped. This is why an aromatic mineral oil capable of absorbing and dissolving PAHs is preferably selected.

Advantageously, the oil must also initially, before it becomes loaded with PAHs, have a low enough viscosity to be circulated and to form a mist at the outlet of the nozzles, in particular a viscosity less than or equal to 75 mm$^2$/s at 0° C., more particularly less than or equal to 73 mm$^2$/s at 0° C. The viscosity is measured as indicated above for the oil mixture.

In one advantageous embodiment, the aromatic mineral oil is a xylene-based oil. A xylene-based oil, such as the synthetic oil sold under the name "Jarytherm AX 320" by the French company Arkema and formed of 85% by weight of mono-xylyl-xylene and 15% by weight of di-xylyl-xylene, has proved effective. This oil has a viscosity of 73 mm$^2$/s at 0° C. and a vapor pressure at 0° C. of less than 1 Pa. The xylene-based aromatic mineral oil sold by the company TOTAL LUBRICANTS under the name "Jarytherm DBT06" and formed of a mixture of dibenzyltoluene isomers has also proved effective. Similarly, the AZOLLA NET HC aromatic oil sold by the company TOTAL LUBRICANTS has also proved particularly effective.

The naphthenic mineral oil that can be used according to invention may be a naphthenic hydrodesulfurized refined light distillate. Its content of paraffinic oil is advantageously less than 50%. In the same way as for the aromatic mineral oil, the naphthenic mineral oil should advantageously remain in the liquid phase during the scrubbing process so as not to produce vapor that is entrained by the effluent gas. The oil used should therefore advantageously have a low enough vapor, pressure not to vaporize at the pressure prevailing at the outlet of the furnace, in order not to load the effluent gas with oil vapor. The naphthenic mineral oil should therefore advantageously have a low vapor pressure, preferably of less than 1 Pa at 0° C. The naphthenic mineral oil should also advantageously have a low enough viscosity to be circulated and to form a mist at the outlet of the nozzles and at the same time to lower the viscosity of the aromatic mineral oil when the latter is loaded with PAHs. Thus, advantageously, the naphthenic mineral oil has a viscosity less than or equal to 75 mm$^2$/s at 0° C., more advantageously less than or equal to 70 mm$^2$/s at 0° C., in particular less than or equal to 60 mm$^2$/s at 0° C. The viscosity is measured as indicated above for the oil mixture. Thus, at atmospheric pressure, advantageously the naphthenic mineral oil according to the present invention remains liquid at a temperature $\geq 200°$ C., advantageously $\geq 210°$ C., more advantageously $\geq 240°$ C., even more advantageously $\geq 250°$ C. In particular, the naphthenic mineral oil sold by the company TOTAL LUBRICANTS under the name "ISOVOLTINE II" (a non-inhibited naphthenic mineral oil) is particularly advantageous within the context of the process according to the present invention.

In a first variant, the naphthenic mineral oil is present from the start of the process. Thus, the mineral oil that will be used for scrubbing the effluent gas comprises (in particular consists of), from the start, a mixture of aromatic mineral oil and naphthenic mineral oil as described above and has in particular a viscosity of 70 mm$^2$/s at 0° C.

In a second variant, the process according to the present invention comprises an initiation phase wherein the mineral oil comprises no naphthenic mineral oil and comprises (in particular consists of) aromatic mineral oil, so as to obtain an aromatic mineral oil loaded with polycyclic aromatic hydrocarbons and having a viscosity of greater than 150 mm$^2$/s at 0° C. The naphthenic mineral oil is then added at the end of the initiation phase to the mineral oil loaded with polycyclic aromatic hydrocarbons in order to reduce the viscosity thereof.

In one particularly advantageous embodiment, the naphthenic mineral oil is added in the form of a mixture of naphthenic mineral oil and aromatic mineral oil as described above. Even more advantageously, this addition is carried out by replacing a portion of the aromatic mineral oil loaded with aromatic hydrocarbons with the same proportion by volume of the mixture of naphthenic mineral oil and aromatic mineral oil, more advantageously by replacing between 20% and 35% of the volume of the aromatic mineral oil loaded with polycyclic aromatic hydrocarbons with the same proportion by volume of the mixture of naphthenic mineral oil and aromatic mineral oil. When the naphthenic oil is in the form of a mixture of naphthenic mineral oil and aromatic mineral oil, this mixture may comprise at least 20% by volume of aromatic mineral oil relative to the total volume of the mixture, advantageously at least 30% by volume of aromatic mineral oil. It may also comprise at most 80% by volume of naphthenic mineral oil relative to the total volume of the mixture, in particular at most 70% by volume of naphthenic mineral oil. Advantageously, the oil mixture has a viscosity of less than or equal to 150 mm$^2$/s at 0° C.

In this second case, there is therefore a wait until the aromatic mineral oil is already loaded with PAHs before adding the naphthenic mineral oil. The process therefore comprises two phases: a first phase referred to as the initiation phase where only the aromatic mineral oil is used for scrubbing the effluent gases and a second phase where a mixture of aromatic mineral oil and naphthenic mineral oil is used for this same scrubbing.

In these two variants, naphthenic mineral oil, in particular in the form of a mixture of naphthenic mineral oil and aromatic mineral oil, may be continually added as soon as the oil mixture used for the scrubbing, after the optional initiation phase, no longer has the desired viscosity due to the loading thereof with PAHs (i.e. has a viscosity of greater than 150 mm$^2$/s at 0° C.), the oil mixture used for the scrubbing thus comprising an increasingly large amount, by volume, of naphthenic oil, until the latter represents the majority component of this mixture, advantageously at most 80% by volume of the oil mixture used for the scrubbing, more particularly at most 70% by volume of this mixture used for the scrubbing.

In these two variants, the scrubbing step is in particular as described in patent application WO 03/047725. Therefore, advantageously, in this way the step of scrubbing the effluent gas is carried out by injecting mineral oil (either the one comprising aromatic mineral oil, or the one comprising the mixture of aromatic mineral oil and naphthenic mineral oil, depending on the variant used and the phase of the process) into an effluent gas stream travelling through a spray tower, for example a Venturi tower.

Advantageously, as described in patent application WO 03/047725, the mineral oil (either the one comprising aromatic mineral oil, or the one comprising the mixture of aromatic mineral oil and naphthenic mineral oil, depending on the variant used and the phase of the process) circulates continuously between a recirculation tank that receives the mineral oil loaded with polycyclic aromatic hydrocarbons and at least one spray nozzle for spraying oil into an effluent gas stream. The mineral oil is preferably cooled over its path between the recirculation tank and the spray nozzle(s). Indeed, this cooling makes it possible to promote the condensation of the PAHs present in the effluent gas to be treated so that the PAHs are entrained by the mineral oil during the spraying. Therefore, advantageously, in this way the temperature of the mineral oil at the inlet to the spray nozzle is below 20° C., advantageously below 0° C. Advantageously, the effluent gas to be treated is not itself cooled before it arrives at the scrubbing location. Thus, advantageously, the temperature of the effluent gas to be treated at the time of the scrubbing is below 200° C.

In particular, the process according to present invention is characterized in that the effluent gas is produced by a chemical vapor infiltration or deposition process for the formation of a pyrolytic carbon deposit on substrates or for the densification of porous substrates by a pyrolytic carbon matrix. These infiltration and deposition processes are well known to a person skilled in the art.

In one advantageous embodiment, the process according to invention comprises an additional step, after the scrubbing step, of passing the effluent gas into a pumping device. Any pumping system known to a person skilled in the art may be used within the context of the process according to the present invention. Advantageously, the pumping of the effluent gas is carried out by passing the scrubbed gas into at least one steam ejector-condenser. Advantageously, at least one portion of the gas from the ejector-condenser is used as combustion gas for a device for producing steam that supplies the ejector-condenser.

Also advantageously, the vapor condensate at the outlet of the ejector-condenser is treated by passing over activated carbon in order to recover light hydrocarbons, in particular benzene hydrocarbons, and an optional residue of PAHs contained in the condensate, etc.

A pyrolytic carbon matrix is formed within the porosity of the substrates by decomposition of the gaseous precursor(s).

The facility that can be used for the implementation of the process according to the present invention is in particular described in patent application WO 03/047725.

The present invention also relates to the use of a naphthenic mineral oil for lowering the viscosity of an aromatic mineral oil loaded with polycyclic aromatic hydrocarbons, advantageously of an aromatic mineral oil containing at most 30% by volume of polycyclic aromatic hydrocarbons.

Advantageously, the polycyclic aromatic hydrocarbons are selected from the list indicated in table 1 and mixtures thereof, advantageously from naphthalene, pyrene, anthracene, acenaphthylene and mixtures thereof.

EXEMPLARY EMBODIMENTS

The process described in patent application WO 03/047725 is carried out using:

the Jarytherm AX 320 aromatic oil described in that application;

the Jarytherm DBT06 aromatic oil;

an oil mixture comprising 70% by volume of a Jarytherm AX 320 aromatic oil and 30% by volume of the mixture of ISOVOLTINE II naphthenic oil (a non-inhibited naphthenic mineral oil) and AZOLLA NET HC aromatic oil, the mixture added having the following proportions by volume: 75% of ISOVOLTINE II naphthenic oil (a non-Inhibited naphthenic mineral oil) and 25% of AZOLLA NET HC aromatic oil.

Figure 2:
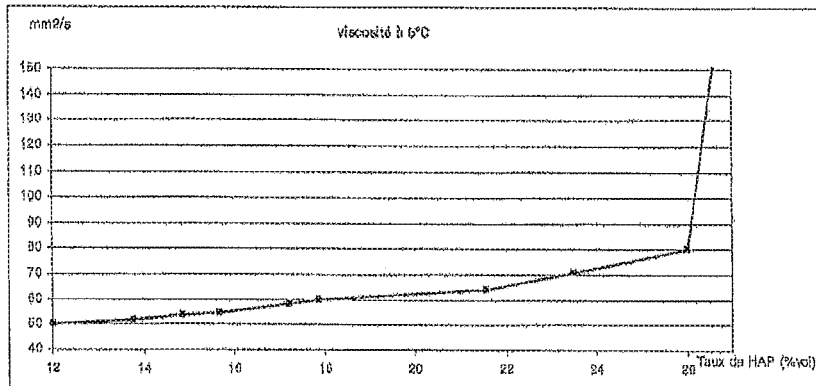
FIG. 2 represents the viscosity at 5° C. of a "Jarytherm AX 320" oil used in the process described by patent application WO 03/047725 as a function of its PAH loading (PAH content by volume).
Figure 3:
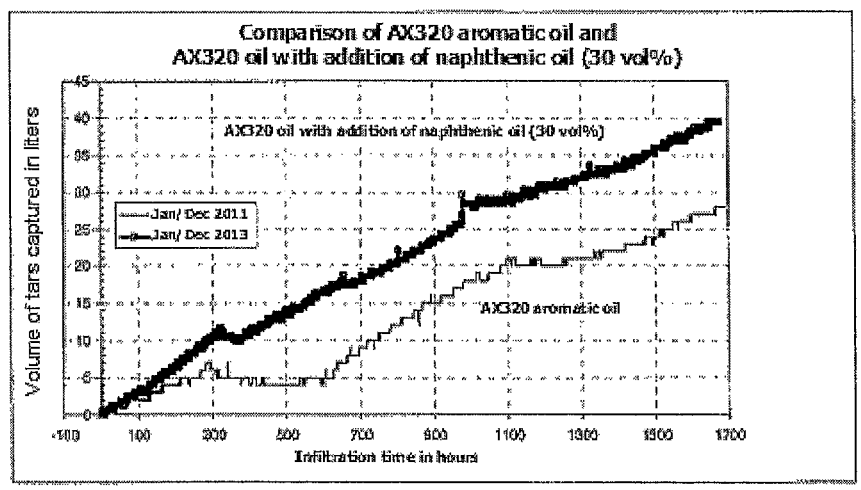
FIG. 3 represents the comparison between the use, in the process described by patent application WO 03/047725, of a Jarytherm AX 320 aromatic oil and of an oil mixture comprising 70% by volume of this oil and 30% by volume of the mixture of ISOVOLTINE II naphthenic oil (a non-inhibited naphthenic mineral oil) and AZOLLA NET HC aromatic oil, the mixture added having the following proportions by volume: 75% of ISOVOLTINE II naphthenic oil (a non-inhibited naphthenic mineral oil) and 25% of AZOLLA NET HC aromatic oil, on the amount of tars captured per liter of oil as a function of the utilization time (in hours).
Figure 4:
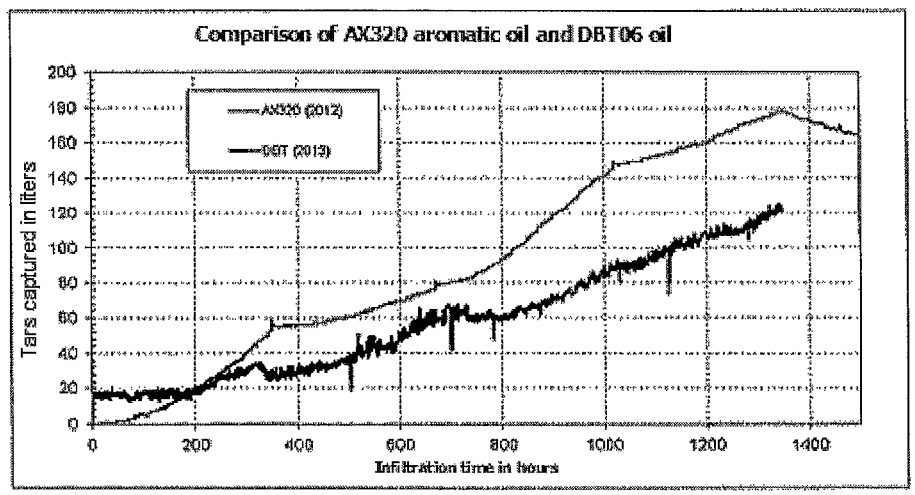
FIG. 4 represents the comparison between the use, in the process described by patent application WO 03/047725, of a Jarytherm AX 320 aromatic oil described in patent application WO 03/047725 and of Jarytherm DBT06 aromatic oil, on the amount of tars captured per liter of oil as a function of the utilization time (in hours).

It is observed that the two aromatic oils have the same behavior (FIG. 4) and that their viscosity increases as a function of the utilization time and therefore of their PAH content (FIGS. 1 and 2).

Furthermore, the presence of the naphthenic oil/aromatic oil (at least 30% by volume) mixture and therefore of naphthenic oil has no impact on the volume of tars captured. The oil mixture can therefore still be used effectively for capturing tars and therefore PAHs, while maintaining a lower viscosity (the viscosity of the naphthenic oil is lower than that of the aromatic oil), which makes it possible to use the mixture for longer time.

The invention claimed is:

1. A process for treating effluent gas containing polycyclic aromatic hydrocarbons comprising a step of spray scrubbing with a mineral oil in order to trap said hydrocarbons, wherein the mineral oil comprises a mixture of aromatic mineral oil and naphthenic mineral oil.

2. The process as claimed in claim 1, wherein the mixture comprises at least 20% by volume of aromatic mineral oil relative to the total volume of the mixture.

3. The process as claimed in claim 1, wherein the mixture has a viscosity less than or equal to 150 mm$^2$/s at 0° C. measured according to the ASTM D445 standard with an Ubbelohde viscometer with capillaries having a diameter of 0.88 mm.

4. The process as claimed in claim 1, wherein the step of spray scrubbing comprises (i) loading the as aromatic mineral oil with polycyclic aromatic hydrocarbons whereby the aromatic mineral oil has a viscosity of greater than 150 mm$^2$/s at 0° C. measured according to the ASTM D445 standard with an Ubbelohde viscometer with capillaries having a diameter of 0.88 mm, and (ii) adding the naphthenic mineral oil to the aromatic mineral oil thus loaded.

5. The process as claimed in claim 4, wherein the naphthenic mineral oil is added in the form of a mixture of naphthenic mineral oil and aromatic mineral oil and wherein the addition is carried out by replacing a portion of the aromatic mineral oil loaded with polycyclic aromatic hydrocarbons with the same proportion by volume of the mixture of naphthenic mineral oil and aromatic mineral oil.

6. The process as claimed in claim 5, wherein the mixture added contains at least 20% by volume of aromatic mineral oil relative to the total volume of the mixture.

7. The process as claimed in claim 1, wherein the aromatic mineral oil has a vapor pressure of less than 1 Pa at 0° C.

8. The process as claimed in claim 1, wherein the aromatic mineral oil is a xylene-based oil.

9. The process as claimed in claim 1, wherein the naphthenic mineral oil has a viscosity less than or equal to 75 mm$^2$/s at 0° C. measured according to the ASTM D445 standard with an Ubbelohde viscometer with capillaries having a diameter of 0.88 mm.

10. The process as claimed in claim 1, wherein the naphthenic mineral oil has a vapor pressure of less than 1 Pa at 0° C.

11. The process as claimed in claim 1, wherein the step of scrubbing the effluent gas is carried out by injecting mineral oil into an effluent gas stream travelling through a spray tower.

12. The process as claimed in claim 1, further comprising circulating the mineral oil continuously between a recirculation tank that receives the mineral oil loaded with polycyclic aromatic hydrocarbons and at least one spray nozzle for spraying oil into an effluent gas stream.

13. The process as claimed in claim 12, further comprising cooling the mineral oil over its path between the recirculation tank and the spray nozzle(s).

14. The process as claimed in claim 1, wherein the effluent gas is produced by a chemical vapor infiltration or deposition process for the formation of a pyrolytic carbon deposit on substrates or for the densification of porous substrates by a pyrolytic carbon matrix.

15. The process as claimed in claim 2, wherein the mixture comprises at least 30% by volume of aromatic mineral oil relative to the total volume of the mixture.

16. The process as claimed in claim 5, wherein the addition is carried out by replacing between 20% and 35% of the volume of the aromatic mineral oil loaded with polycyclic aromatic hydrocarbons with the same proportion by volume of the mixture of naphthenic mineral oil and aromatic mineral oil.

17. The process as claimed in claim 7, wherein the mixture added contains at least 30% by volume of aromatic mineral oil relative to the total volume of the mixture.

18. The process as claimed in claim 9, wherein the naphthenic mineral oil has a viscosity less than or equal to 70 mm$^2$/s at 0° C. measured according to the ASTM D445 standard with an Ubbelohde viscometer with capillaries having a diameter of 0.88 mm.

19. The process as claimed in claim 18, wherein the naphthenic mineral oil has a viscosity less than or equal to 60 mm$^2$/s at 0° C. measured according to the ASTM D445 standard with an Ubbelohde viscometer with capillaries having a diameter of 0.88 mm.

* * * * *